United States Patent

Adelmann et al.

[11] Patent Number: 5,355,281
[45] Date of Patent: Oct. 11, 1994

[54] ELECTRICAL DEVICE HAVING A BONDED CERAMIC-COPPER HEAT TRANSFER MEDIUM

[75] Inventors: Harald E. Adelmann, Kirchberg; Hans P. Peschl, Pachernweg, both of Austria

[73] Assignee: E.B.G. Elektronische Bauelemente Gesellschaft m.b.H., Austria

[21] Appl. No.: 82,961

[22] Filed: Jun. 29, 1993

[51] Int. Cl.$^5$ .............................................. H05K 7/20
[52] U.S. Cl. .................................... 361/707; 257/707; 257/729; 338/51; 361/713
[58] Field of Search ................... 338/51, 275; 428/209, 428/328, 329, 615, 620, 901; 174/16.3; 165/80.3, 185; 257/706, 707, 713, 729; 361/704, 707, 708, 720, 713, 714, 718, 722, 792

[56] References Cited

U.S. PATENT DOCUMENTS

| | | | |
|---|---|---|---|
| 3,955,169 | 5/1976 | Kerfoot | 338/51 |
| 4,227,036 | 10/1980 | Fitzgerald | 174/16.3 |
| 4,811,166 | 3/1989 | Alvarez | 361/386 |
| 4,963,414 | 10/1990 | LeVasseur | 428/195 |
| 5,022,462 | 6/1991 | Flint | 165/80.3 |
| 5,179,366 | 1/1993 | Wagner | 338/51 |
| 5,276,423 | 1/1994 | Breit | 338/308 |
| 5,282,111 | 1/1994 | Hopfer | 361/704 |

*Primary Examiner*—Gerald P. Tolin
*Attorney, Agent, or Firm*—Rhodes, Coats & Bennett

[57] ABSTRACT

The present invention relates to an electrical device such as a resistor or silicon controlled rectifier that is provided with an improved heat transfer medium for transferring heat from the device to an adjacent structure such as a mounting panel. The improved heat transfer medium includes a bonded series of laminates including a layer of nickel-plated copper sandwiched between two layers of ceramic, such as aluminum oxide.

4 Claims, 1 Drawing Sheet

ELECTRICAL DEVICE HAVING A BONDED CERAMIC-COPPER HEAT TRANSFER MEDIUM

FIELD OF INVENTION

The present invention relates to electrical devices having a heat transfer medium associated therewith for transferring heat from the electrical device during operation of the device.

BACKGROUND OF THE INVENTION

Electrical devices such as resistors, silicon controlled rectifiers, power amplifiers, etc., generate substantial quantities of heat during operation- To maintain these devices and to provide for efficient operation it is necessary to transfer heat from the electrical device during operation. Typically, such electrical devices are enclosed within a housing and are provided with some form of a metal plate that acts as a heat transfer medium. Usually, the metal plate is disposed adjacent the resistor or the heat generating element and heat generated by the resistor or heat generating element is transferred to the plate. In many cases the metal heat transfer medium forms the back of the housing and is secured directly to a metal panel. Consequently, heat is transferred from the resistor or other type of heat generating element to the metal plate and from the metal plate to the panel.

The one major drawback to this approach is that such conventional metal heat transfer plates are very inefficient. They tend to heat up in spots and do not efficiently distribute heat uniformly throughout the metal heat transfer medium. This inefficiency in heat transfer results in the associated electrical device being large in size and restricted in its power production.

SUMMARY AND OBJECTS OF THE INVENTION

The present invention entails an electrical device such as a resistor that is provided with an improved heat transfer medium. More particularly, the heat transfer medium includes a bonded ceramic-copper laminate that is substantially more efficient than conventional metallic heat transfer mediums that are typically used in electrical devices. Tests indicate that the laminated series of aluminum oxide and copper layers have the capacity to handle approximately twice the quantity of heat as conventional metallic heat transfer mediums.

It is therefore an object of the present invention to provide an electrical device such as a resistor, silicon controlled rectifier, etc., with an improved heat transfer medium.

Another object of the present invention is to provide an improved heat transfer medium for an electrical device that not only has superior heat transfer characteristics but is also an excellent electrical insulator.

A further object of the present invention is to provide an improved heat transfer medium for an electrical device of the character referred to above wherein the heat transfer medium is compatible with the overall structure and design of the electrical device.

Other objects and advantages of the present invention will become apparent and obvious from a study of the following description and the accompanying drawings which are merely illustrative of such invention.

DETAILED DESCRIPTION OF THE INVENTION

Figure 1:
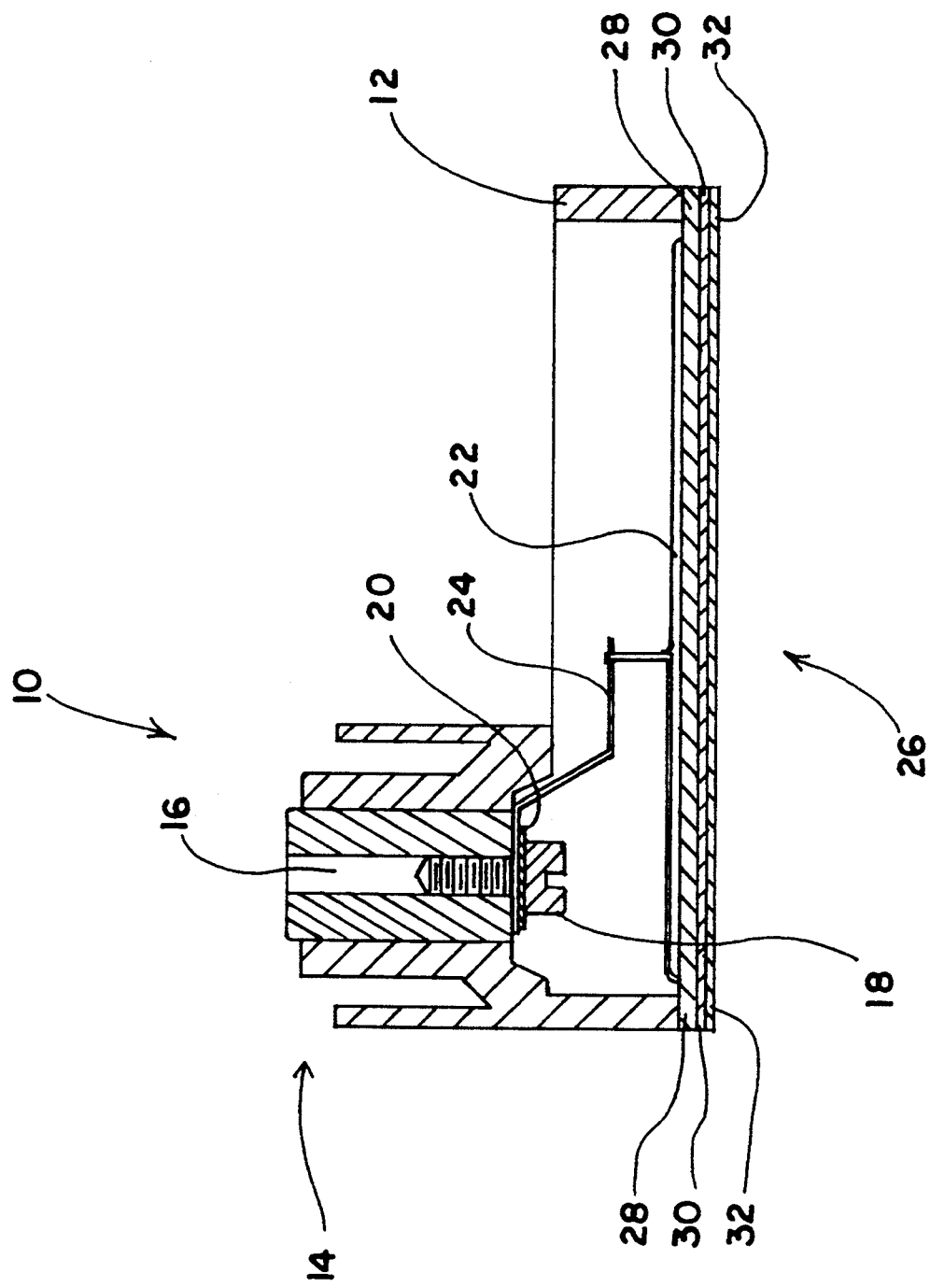
FIG. 1 is a cross-sectional view of an electrical resistor showing the bonded ceramic-copper laminated heat transfer medium incorporated therein.

With further reference to the drawings the electrical device having the improved heat transfer medium incorporated therein is shown in the drawings and indicated generally by the numeral 10. In the embodiment of the invention illustrated, the electrical device 10 comprises a resistor. However, it should be appreciated that the electrical device of the present invention having the improved heat transfer medium could be in the form of a silicon controlled rectifier, power amplifier, etc.

Viewing the electrical device in more detail, it is seen that the same includes a housing structure 12 including a terminal area that is indicated generally by the numeral 14. Terminal area 14 includes a central bore and disposed with the central bore is a metal terminal 16. A connecting screw 18 extends up through the terminal area 14 and particularly up through the metal terminal 16. A washer 20 is disposed between the screw head of the connecting screw 18 and the housing 12.

As noted above, the electrical device 10 of the present invention as disclosed herein, comprises a resistor. Accordingly, disposed within the bottom area of housing 12 is a conventional resistor 22. Resistor 22, of course, generates heat during its operation and can be of any conventional resistor type. A connecting wire 24 is connected to resistor 22 and extends therefrom to where the same connects to the metal terminal 16.

Disposed below resistor 22 and forming the back of housing 12 is a heat transfer medium indicated generally by the numeral 26. As illustrated in the drawings, in the embodiment illustrated herein, the resistor 22 lies atop the heat transfer medium 26 and is actually secured thereto.

Turning to a discussion of the heat transfer medium 26, it is seen that the same comprises a series of bonded or laminated substrates. In particular, as viewed in FIG. 1, the top substrate or layer that is disposed adjacent resistor 22 comprises a ceramic layer 28. The ceramic layer 28 is preferably an aluminum oxide ($AL_2O_3$) ceramic. However, many other ceramic compositions could also be used including steatite and berylium oxide (BeO). Disposed adjacent the ceramic layer 28 and bonded thereto is a copper (CU) layer or substrate 30. Finally, disposed adjacent the copper layer 30 opposite the first ceramic layer 28 is a second ceramic layer or substrate 32 also made of aluminum oxide. Thus, in a preferred embodiment, the total heat transfer medium disclosed in FIG. 1 comprises two separate aluminum oxide ceramic layers 28 and 32 that effectively sandwich one copper layer or substrate. It should be appreciated that the substrate or layers referred to as aluminum oxide ceramic are not totally pure as they would preferably contain approximately 96% aluminum oxide.

In a preferred embodiment the upper aluminum oxide ceramic layer 28 would include a top that supports the resistor 22 and wherein the same top would preferably be provided with solder connections which would be used in the assembling of the electrical device. In a preferred design the bottom of the upper aluminum oxide ceramic layer 28 would be covered with a silver metalization. The silver metalization process can be accomplished through a conventional screen printing process and is solderable.

With respect to the intermediate copper substrate or layer 30 it is preferred that the same be nickel-plated by a chemical deposition process. This nickel metalization would also be solderable.

Finally, the lower aluminum oxide ceramic substrate or layer 32 would also be nickel-plated. In the alternative, with respect to the lower or third aluminum oxide layer 32, the same could be metalized by a screen printing process with silver on the top and bottom sides of the substrate and then the same could be nickel-plated all around by a chemical or galvanic deposition process.

The size and thicknesses of the various substrates comprising the heat transfer medium 26 may vary. However, in a preferred embodiment, it has been found that the top aluminum oxide ceramic layer 28 can be of thickness of 1.27 mm with the copper substrate or layer 30 being 0.6 mm and the third or lower aluminum oxide ceramic layer 32 being 0.63 mm.

It is appreciated that the respective substrates 28, 30 and 32 would be bonded or laminated together by a conventional bonding or lamination process.

The composite heat transfer medium 26, because of its design and makeup, will be generally uniformly heated throughout and will not exhibit spot heating such as found in conventional metallic heat transfer mediums. This gives the heat transfer medium 26 the potential for transferring as much as 200% of the heat of a conventional metallic heat transfer plate. This enables the overall electrical device 10 to be fabricated in a smaller size and/or capable of producing greater power. Further, with the heat transfer medium 26 of the present invention the electrical device 10 can efficiently operate at 200 degrees C. and above. The operating temperature of the heat transfer medium 26 is only limited by the melting temperature of the used solder material.

The present invention may, of course, be carried out in other specific ways than those herein set forth without departing from the spirit and essential characteristics of the invention. The present embodiments are, therefore, to be considered in all respects as illustrative and not restrictive and all changes coming within the meaning and equivalency range of the appended claims are intended to be embraced therein.

What is claimed is:

1. An electrical device having an improved heat transfer medium comprising:
   a) a housing structure;
   b) at least one heat generating element disposed within the housing;
   c) a heat transfer medium disposed in contact with the heat generating element for transferring heat from the heat generating element;
   d) said heat transfer medium including:
      1) a first aluminum oxide ceramic layer having an outer surface engaged with the heat generating element and having an inner surface;
      2) a second aluminum oxide ceramic layer having an outer surface and an inner surface and wherein at least one of the said ceramic layers is nickel-plated on one of said surfaces;
      3) a copper layer disposed between the first and second ceramic layers and having nickel-plated opposing surfaces bonded to the inner surfaces of the first and second ceramic layers such that the copper layer is sandwiched between said first and second ceramic layers; and
      4) wherein heat generated by the heat generating element is generally uniformly dissipated through the layers of the transfer medium.

2. The electrical device of claim 1 wherein said second ceramic layer is nickel-plated on its inner and outer surfaces.

3. The electrical device of claim 1 wherein the inner surface of the first ceramic layer is plated with silver.

4. The electrical device of claim 1 wherein at least one of the outside aluminum oxide ceramic layers is at least approximately twice as thick as the intermediate copper layer.

* * * * *